US 7,665,055 B2

(12) United States Patent
Kobayashi

(10) Patent No.: US 7,665,055 B2
(45) Date of Patent: Feb. 16, 2010

(54) SEMICONDUCTOR APPARATUS DESIGN METHOD IN WHICH DUMMY LINE IS PLACED IN CLOSE PROXIMITY TO SIGNAL LINE

(75) Inventor: Naohiro Kobayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 284 days.

(21) Appl. No.: 11/790,794

(22) Filed: Apr. 27, 2007

(65) Prior Publication Data
US 2007/0288879 A1 Dec. 13, 2007

(30) Foreign Application Priority Data
May 17, 2006 (JP) ............... 2006-138211

(51) Int. Cl.
*G06F 17/50* (2006.01)
(52) U.S. Cl. .................. 716/10; 716/8; 716/9; 716/11; 716/12; 716/19; 716/20; 716/21; 438/622; 438/691
(58) Field of Classification Search ............... 716/8–12, 716/19–21; 438/622, 691
See application file for complete search history.

(56) References Cited
U.S. PATENT DOCUMENTS

| 6,057,171 | A | * | 5/2000 | Chou et al. | 438/15 |
|---|---|---|---|---|---|
| 6,103,626 | A | * | 8/2000 | Kim | 438/691 |
| 6,717,267 | B1 | * | 4/2004 | Kunikiyo | 257/758 |
| 6,751,785 | B1 | * | 6/2004 | Oh | 716/10 |
| 6,816,999 | B2 | * | 11/2004 | Lee | 716/5 |
| 6,884,550 | B2 | | 4/2005 | Morita | |
| 6,904,581 | B1 | * | 6/2005 | Oh | 716/10 |
| 7,383,521 | B2 | * | 6/2008 | Smith et al. | 716/6 |
| 7,448,014 | B2 | * | 11/2008 | Lavin et al. | 716/12 |
| 2004/0188679 | A1 | * | 9/2004 | Ireland | 257/48 |
| 2005/0132306 | A1 | * | 6/2005 | Smith et al. | 716/1 |
| 2005/0183049 | A1 | * | 8/2005 | Ohba et al. | 716/5 |
| 2006/0035456 | A1 | * | 2/2006 | Ramakrishnan et al. | 438/622 |
| 2007/0059610 | A1 | * | 3/2007 | Jeong et al. | 430/5 |
| 2007/0220459 | A1 | * | 9/2007 | Gurney | 716/5 |
| 2007/0256039 | A1 | * | 11/2007 | White | 716/4 |

FOREIGN PATENT DOCUMENTS

JP 2000-277615 A 10/2000
JP 2003-140319 A 5/2003

OTHER PUBLICATIONS

Kahng et al.;"Study of floating fill impact on interconnect capacitance"; Quality Electronic Design; ISQED '06; 7th International Symposium on Mar. 27-29, 2006 pp. 691-696.*

* cited by examiner

*Primary Examiner*—Naum B Levin
(74) *Attorney, Agent, or Firm*—Foley & Lardner LLP

(57) ABSTRACT

A design method places a dummy line in floating state in a line layer of a semiconductor apparatus by using a computer. The method includes a first step of reading layout data and placing a dummy line with a longitudinal side lying in parallel with a signal line in an area where a pattern density of the signal line in a prescribed area is equal to or lower than a density lower limit, and a second step of dividing a dummy line placed in an area where a distance from the signal line is equal to or shorter than a dummy dividing distance.

8 Claims, 7 Drawing Sheets

RELATED ART

SEMICONDUCTOR APPARATUS DESIGN METHOD IN WHICH DUMMY LINE IS PLACED IN CLOSE PROXIMITY TO SIGNAL LINE

BACKGROUND OF THE INVENTION

1. Field of the Invention

The present invention relates to a method of designing a semiconductor apparatus and, particularly, to a method of designing a semiconductor apparatus in which a dummy line is placed in close proximity to a signal line.

2. Description of Related Art

Recent semiconductor apparatus include multilayered lines. The multilayered lines have a problem that a line of an upper layer is subject to breaking due to unevenness of a line of a lower layer. To address such a problem, there is a technique that equalizes the pattern density of an entire chip for each layer. This technique is disclosed in Japanese Unexamined Patent Application Publication No. 2003-140319 (Related art 1).

FIG. 7 schematically shows the layout of a semiconductor apparatus 100 according to the related art 1. As shown in FIG. 7, the semiconductor apparatus 100 includes a signal line 101 and a dummy line 102. According to the related art 1, if the pattern density in a given area does not reach a predetermined value, the dummy line 102 is placed in an area where the signal line 101 is not placed. The dummy line 102 has a prescribed line width. A space between signal lines is filled by the dummy line, thereby allowing a data rate within a mask to reach a predetermined value. It is therefore possible to equalize the surface of a line layer. Placing a dummy line which covers a large area enables reduction of a mask data amount.

On the other hand, as a manufacturing process of semiconductor apparatus has been moved to finer design rules, a distance between lines becomes shorter. A line is generally a metal line. If a distance between lines is short, capacitance coupling occurs between lines and parasitic capacitance increases accordingly. Further, if an area of a metal line is larger, parasitic capacitance increases accordingly. Thus, parasitic capacitance increases as a distance between adjacent metal lines is shorter and a total area of the metal lines is larger. Therefore, if a large dummy line is placed in close proximity to a signal line, parasitic capacitance of lines increases to cause larger signal transmission delay. To address this, a method of arranging dummy lines in consideration of capacitance coupling between lines and parasitic capacitance is disclosed in Japanese Unexamined Patent Application Publication No. 2000-277615 (Related art 2).

FIG. 8 shows a semiconductor apparatus 200 according to the related art 2. As shown in FIG. 8, the semiconductor apparatus 200 includes a signal line 201 and dummy lines 202 and 203. The dummy lines 202 and 203 are in the form of blocks that respectively have a predetermined area. The dummy line 202 has a small dummy line area, and the dummy line 203 has a large dummy line area. According to the related art 2, the dummy line 202 with a small dummy line area is placed in the area adjacent to the signal line 201, and the dummy line 203 with a large dummy line area is placed in the area not adjacent to the signal line 201. The dummy line which is adjacent to the signal line 201 is thereby small, which shortens a length where the signal line 201 and a dummy line are arranged in parallel. This prevents the occurrence of capacitance coupling between a signal line and a dummy line and reduces an increase in parasitic capacitance of a signal line.

However, the related art 2 has a problem that the number of patterns increases as the number of blocks increases. In the recent manufacturing process with finer design rules, optical proximity correction (OPC) is generally made for each of the patterns in a mask. Thus, if the number of patterns is large, it takes an enormous amount of time for the OPC process. Further, an increase in the number of patterns causes an increase in cost for mask production.

During a manufacturing process, a defect is attached randomly on semiconductor apparatus. In the recent manufacturing process with finer design rules, a signal line and a dummy line can be short-circuited due to the effect of such a defect or the like because a distance between the lines is short. If a signal line and a dummy line are short-circuited, an area of the signal line apparently increases, which causes an increase in parasitic capacitance of the signal line. This leads to an increase in signal transmission delay, causing malfunction of a semiconductor apparatus. Because the short-circuit which occurs due to a defect only causes an increase in parasitic capacitance of lines and does not cause any problem in logic operation, it is often unable to detect the defect in a delivery inspection process. The related arts 1 and 2 do not take the effect of such a defect into account. Therefore, upon the occurrence of short-circuit due to a defect, parasitic capacitance of a signal line increases and a signal delay occurs, which can cause malfunction of semiconductor apparatus.

SUMMARY

According to one aspect of the present invention, there is provided a design method for placing a dummy line in floating state in a line layer of a semiconductor apparatus by using a computer. The method includes a first step of reading layout data and placing a dummy line with a longitudinal side lying in parallel with a signal line in an area where a pattern density of the signal line in a prescribed area is equal to or lower than a density lower limit, and a second step of dividing a dummy line placed in an area where a distance from the signal line is equal to or shorter than a dummy dividing distance.

In the design method of a semiconductor apparatus according to the above aspect of the present invention, a dummy line which is placed in an area where a distance from a signal line is shorter than a dummy dividing distance Z has a shorter side in parallel with the signal line compared with a dummy line which is placed in an area where a distance from the signal line is longer than the dummy dividing distance Z. Therefore, even if a defect is attached to the area including the signal line and the signal line and the dummy line are short-circuited, it is possible to suppress an increase in line area due to the dummy line and reduce an increase in parasitic capacitance of the line. Therefore, the design method of a semiconductor apparatus according to the above aspect of the present invention can suppress an increase in delay of signals transmitted through a signal line to thereby improve the reliability of the semiconductor apparatus.

According to another aspect of the present invention, there is provided a computer program product, in a computer readable medium, including instructions executed by a computer for causing the computer to implement a method for placing a dummy line in floating state in a line layer of a semiconductor apparatus. The method includes a first step of reading layout data and placing a dummy line with a longitudinal side lying in parallel with a signal line in an area where a pattern density of the signal line in a prescribed area is equal to or lower than a density lower limit, and a second step of dividing a dummy line placed in an area where a distance from the signal line is equal to or shorter than a dummy dividing distance.

A semiconductor apparatus and its design method according to the present invention can suppress an increase in parasitic capacitance of a signal line even if short-circuit occurs between a signal line and a dummy line, thus improving the reliability of the semiconductor apparatus.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
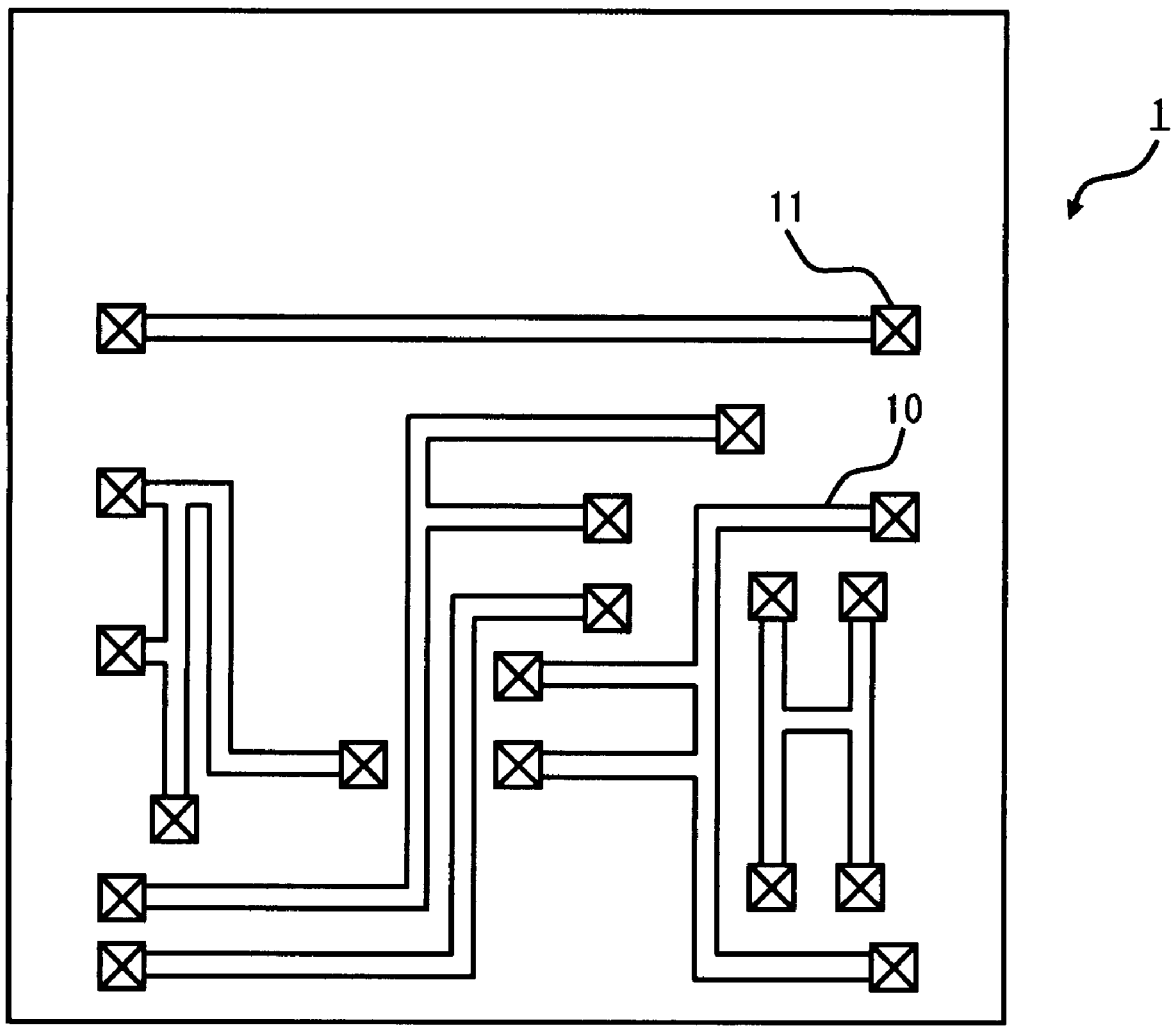
FIG. 1 is a schematic view of the layout of a semiconductor apparatus according to a first embodiment of the present invention.

Exemplary embodiments of the present invention are described hereinafter with reference to the drawings. FIG. 1 schematically shows the layout regarding a metal line layer 1, which is one of metal line layers in a semiconductor apparatus according to a first embodiment of the invention. As shown in FIG. 1, the metal line layer 1 includes a signal line 10 and a via 11. The signal line 10 is a metal line which serves as a transmission path of signals that are processed in the semiconductor apparatus. The via 11 is a connection terminal between the signal line 10 and a device or a line which are placed in another layer.

Figure 2:
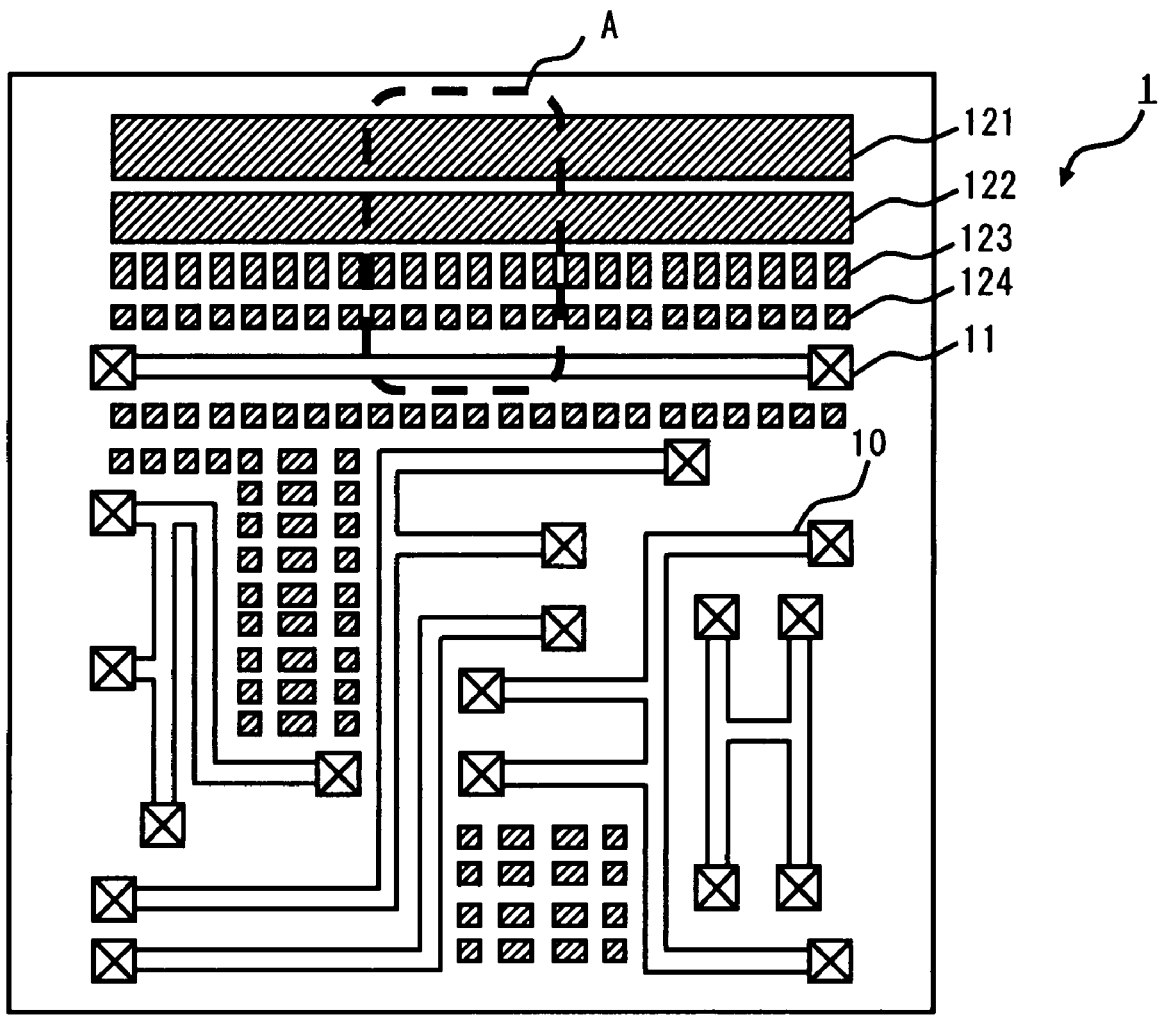
FIG. 2 is a schematic view of the layout, in which dummy lines are placed, of the semiconductor apparatus according to the first embodiment of the present invention.

In the metal line layer 1 shown in FIG. 1, the pattern density of signal lines differs by area. Thus, in the semiconductor apparatus of this embodiment, a dummy line, which is placed in a "floating state" with no connection to any line, is placed in the area where the pattern density of signal lines is low. FIG. 2 schematically shows the layout where dummy lines are placed in the metal line layer 1.

As shown in FIG. 2, dummy lines 121 to 124 having different line width a replaced in this embodiment. The line width of the dummy lines varies according to a distance between each dummy line and the signal line 10. In this embodiment, a dummy line width decreases as a dummy line is closer to the signal line 10. In FIG. 2, the dummy line 121 is the widest and the dummy line 124 is the narrowest.

Further, as shown in FIG. 2, a dummy line which is close to the signal line 10 with a distance shorter than a predetermined distance is divided so that the length of its line which lies in parallel with the signal line 10 is shorter; than that of the dummy line which is away from the signal line 10. In FIG. 2, the dummy lines 123 and 124 are divided.

Figure 3:
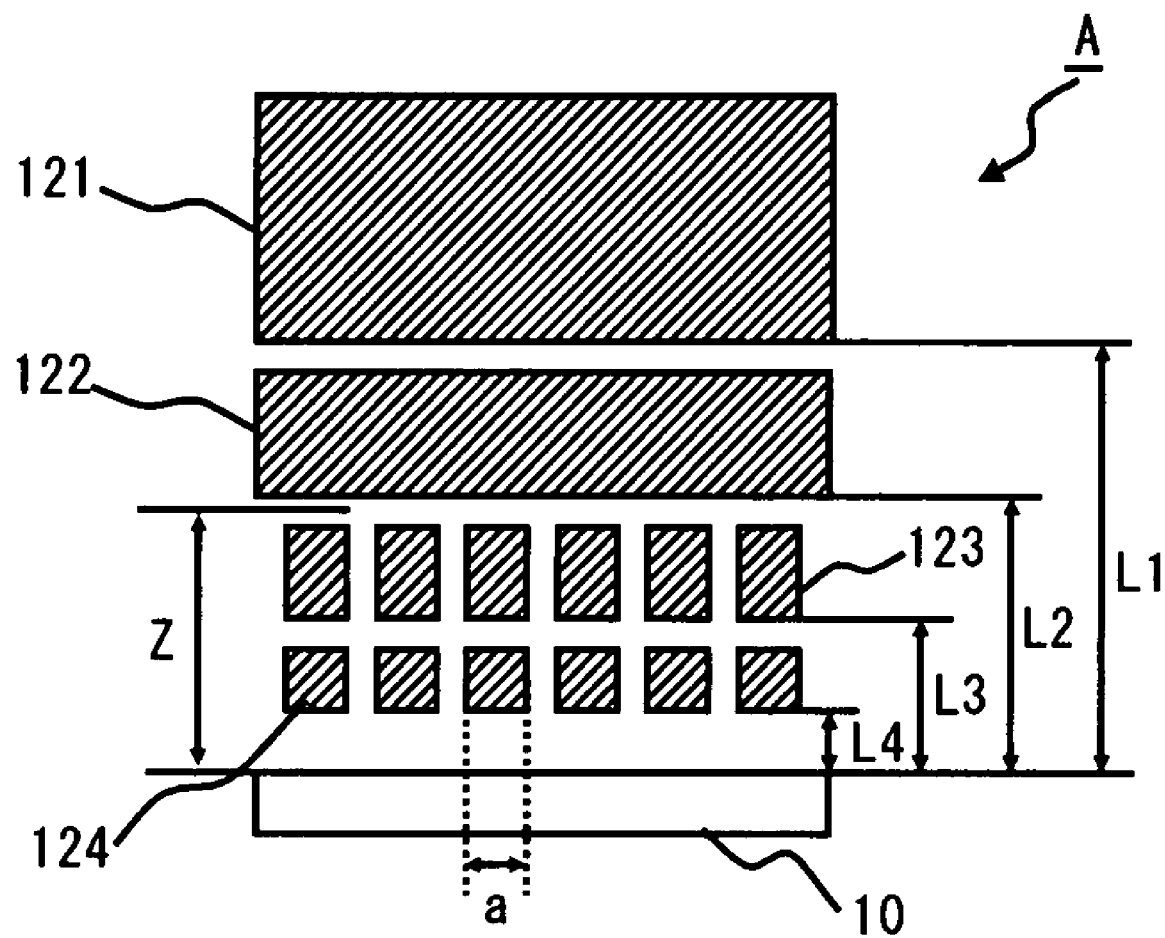
FIG. 3 is an enlarged view of an area A of the layout shown in FIG. 2.

FIG. 3 shows an enlarged view of the area A in FIG. 2. A dummy line is described hereinafter in detail with reference to FIG. 3. In this embodiment, a distance between the dummy line 121 and the signal line 10 is L1, a distance between the dummy line 122 and the signal line 10 is L2, a distance between the dummy line 123 and the signal line 10 is L3, a distance between the dummy line 124 and the signal line 10 is L4 as shown in FIG. 3. The lengths of those distances are: L1>L2>L3>L4. The dummy lines 123 and 124 are divided because a distance from the signal line 10 is shorter than a dummy dividing distance Z. The dummy dividing distance Z is a value that is set according to a maximum value of a defect which can be attached during a manufacturing process. The dummy dividing distance Z may be about 2 μm, for example.

In the dummy lines 123 and 124, a length a of the side which lies in parallel with the signal line 10 can be set as appropriate. In this embodiment, the length a is a predetermined and the dummy lines 123 and 124 have equal lengths of a. The length a may correspond to the number of divided lines after dividing one dummy line, for example.

Figure 4:
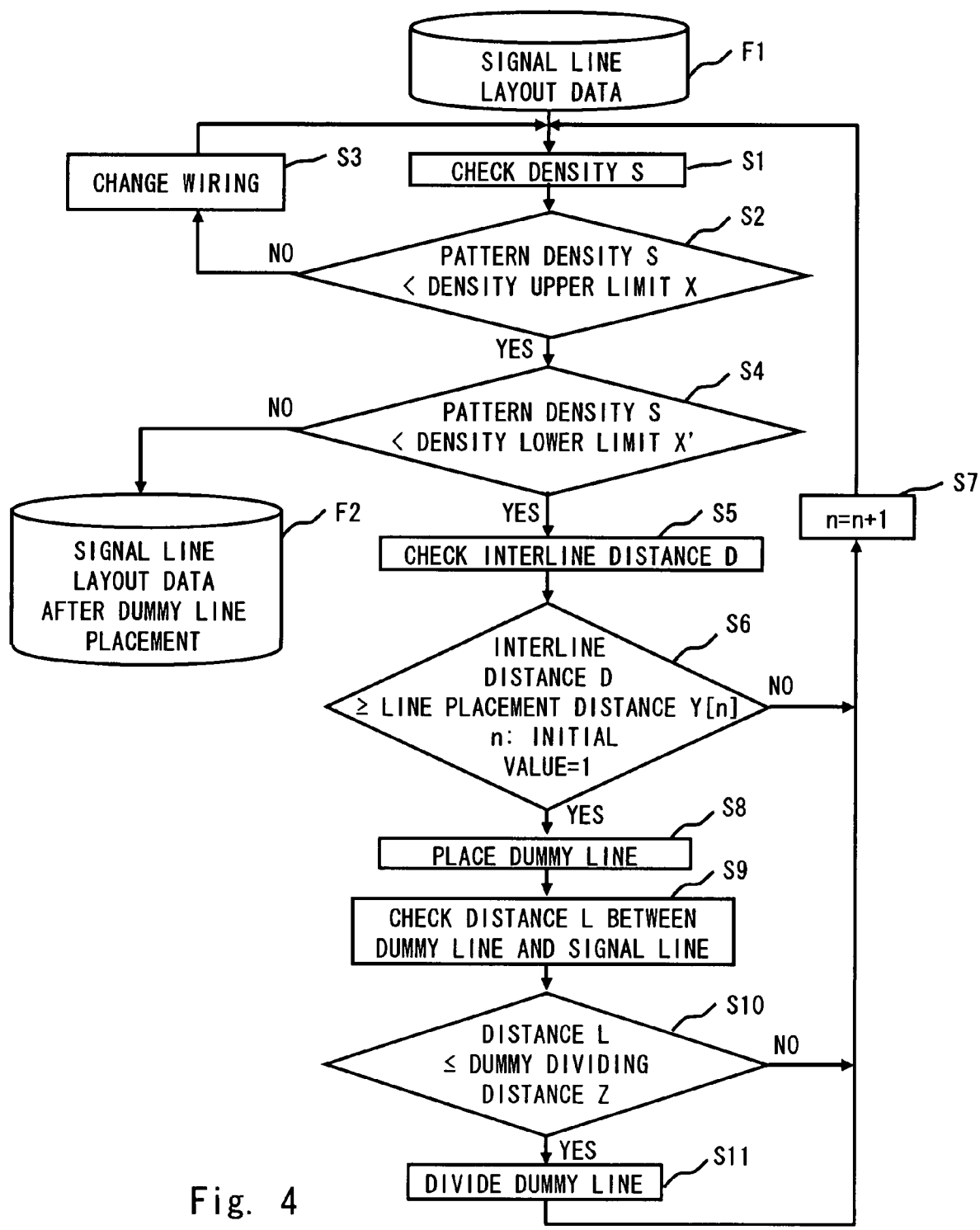
FIG. 4 is a flowchart of the process to place dummy lines according to the first embodiment of the present invention.

The dummy lines are placed after completing the layout of signal lines. The placement of the dummy lines is carried out by executing a program on a computer or the like. The process to place dummy lines is described hereinafter. FIG. 4 shows a flowchart for placing dummy lines. A program of placing dummy lines executes the process of the flowchart of FIG. 4 on a computer to thereby create layout data where dummy lines are placed. The flowchart of this embodiment includes a first step (e.g. Step S8) that places a dummy line in such a way that its longitudinal side is parallel with a signal line in the area where the pattern density of signal lines in a prescribed area is equal to or lower than a density lower limit, and a second step (e.g. Step S11) that divides the dummy line which is placed in the area where a distance from a signal line is equal to or shorter than a dummy dividing distance.

As shown in FIG. 4, the placement process of dummy lines according to this embodiment first reads the data containing the layout of signal lines (signal line layout data F1). Based on the signal line layout data F1, the process calculates a total area of metal lines which are placed within a given area and checks a pattern density S of the signal line layout data (Step S1). The process then compares the pattern density S obtained in Step S1 and a predetermined density upper limit X (Step S2). If the pattern density S exceeds the density upper limit X (No in Step S2), the process changes the wiring (Step S3). The wiring may be changed in Step S3 by altering line paths or modifying added dummy lines, for example.

On the other hand, if the pattern density S is below the density upper limit X (Yes in Step S2), the process determines if the pattern density S falls below a density lower limit X' (Step S4). The values of the density upper limit X and the density lower limit X' are set depending on a manufacturing process, which may be a pattern density that allows recreation of a pattern without changing manufacturing conditions in the manufacturing process, for example.

If the pattern density S is equal to or larger than the density lower limit X' (No in Step S4), the layout data after the pattern density S has been checked in Step S1 is output as signal line layout data F2 after dummy line placement. On the other hand, if the pattern density S falls below the density lower limit X' (Yes in Step S4), the process checks an interline distance D (Step S5). Based on the result of Step S5, the process searches the area where the interline distance D is larger than a line placement distance Y[n] (Step S6).

The line placement distance Y[n] defines a distance between a dummy line to be placed and a signal line. In this embodiment, a plurality of line placement distances are preset, and a line placement distance is set smaller each time the process of Step S6 is repeated. For example, if four different line placement distances Y[1] to Y[4] are preset, Y[1] is the largest value and Y[4] is the smallest value. In the dummy line placement process, an initial value of the line placement distance Y[n] is "1".

If the area where the interline distance D is larger than the line placement distance Y[n] is not found (No in Step S6), the process increments the value of N by one and repeats the process from Steps S1 to S6. If, on the other hand, the area where the interline distance D is larger than the line placement distance Y[n] is found (Yes in Step S6), a dummy line is placed in the area (Step S8). The width of the dummy line which is placed in Step S8 is determined based on the line placement distance Y[n]. For example, the dummy line 121 having the largest line width may be placed corresponding to the line placement distance Y[1].

After that, the process checks a distance L between the placed dummy line and the signal line (Step S9). Based on the result of Step S9, the process compares the distance L between the dummy line and the signal line with a dummy dividing distance Z (Step S10). If the distance L is longer than the dummy dividing distance Z (No in Step S10), the process returns to Step S1 for checking the pattern density through Step S7. If, on the other hand, the distance L is shorter than the dummy dividing distance Z (Yes in Step S10), the process divides the relevant dummy line (Step S11).

The dummy line is divided in Step S11 so that the length a of the side of the divided dummy line which lies in parallel with the signal line is a predetermined length. The length a is the same for the dummy lines 123 and 124. After completing Step S11, the process returns to. Step S1 for pattern density check through Step S7.

As described above, according to the semiconductor apparatus design method of this embodiment, a dummy line whose distance from to a signal line is smaller than the dummy dividing distance Z is divided. The dummy dividing distance Z is set to about 2 μm. In recent process, a maximum value of the size of an assumed defect is about 2 μm. Thus, upon the occurrence of short-circuit between a signal line and a dummy line due to a defect, the short-circuit occurs only in the divided dummy lines 123 and 124, and the dummy lines 121 and 122, which are not divided, are not short-circuited with a signal line. Thus, even if short-circuit due to a defect occurs, parasitic capacitance of lines which increases due to the short-circuit is only the parasitic capacitance of the dummy lines 123 and 124., which have small areas. Therefore, even if a defect is attached between a signal line and a dummy line during manufacturing process, an increase in the parasitic capacitance of lines is kept as small as negligible, thereby suppressing an increase in signal delay of a semiconductor apparatus.

Further, according to the semiconductor apparatus and its design method of this embodiment, the dummy lines which are away from a signal line are not divided and they have a large area. This suppresses an increase in data amount of mask pattern. If a data amount is small, a processing time of optical proximity correction (OPC) is short. This reduces a time for creating a mask. In addition, this reduces the number of patterns, thereby lowering a cost for manufacturing masks.

Furthermore, according to the semiconductor apparatus of this embodiment, a dummy line which is closer to a signal line has a smaller line width. This suppresses an increase in parasitic capacitance due to capacitance coupling between lines. Further, a dummy line which is placed in close proximity to a signal line is divided. Therefore, a distance where the side of a signal line adjacent to a dummy line and the side of the dummy line adjacent to the signal line lie in parallel with each other is shorter than that before dividing the dummy line. Thus, dividing a dummy line can also prevent an increase in parasitic capacitance due to capacitance coupling between lines.

Second Embodiment

Figure 5:
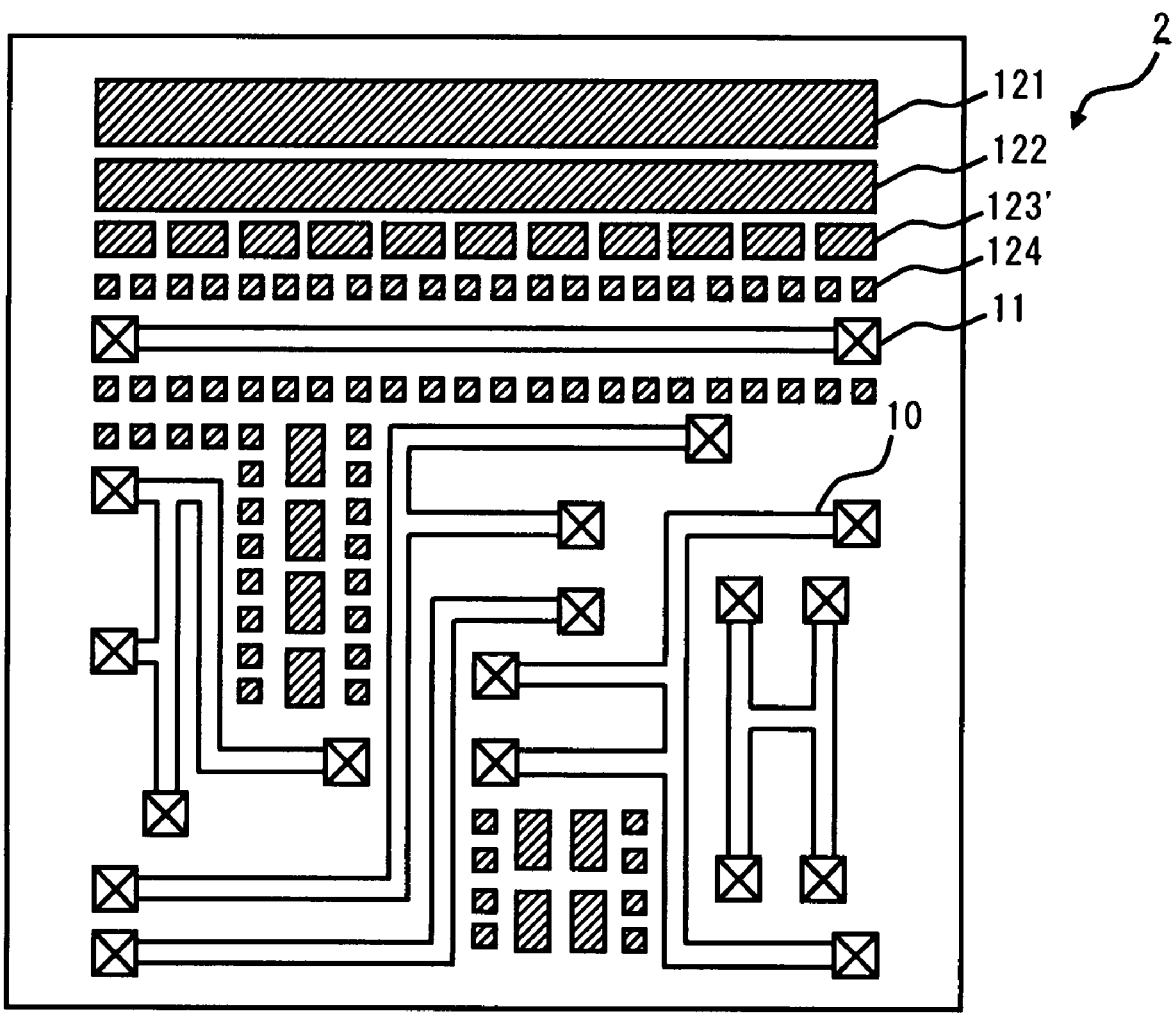
FIG. 5 is a schematic view of the layout, in which dummy lines are placed, of a semiconductor apparatus according to a second embodiment of the present invention.

A semiconductor apparatus 2 according to a second embodiment of the present invention is substantially the same as the semiconductor apparatus 1 according to the first embodiment. In the semiconductor apparatus 1 of the first embodiment, the length a of the side of a divided dummy line which is in parallel with a signal line is equal. On the other hand, in the semiconductor apparatus 2 of the second embodiment, the length a of the side of a divided dummy line which is in parallel with a signal line differs according to a distance from the signal line. FIG. 5 schematically shows the layout of the semiconductor apparatus according to the second embodiment of the invention.

As shown in FIG. 5, the length of the side of the divided dummy line 123' which is in parallel with a signal line is longer than the length of the side of the divided dummy line 124 which closer to the signal line than the dummy line 123'. In the second embodiment, the length of the side of a divided dummy line which is in parallel with a signal line is determined to satisfy X>a*(Z−L), for example. The value X may be a preset value (e.g. a specified value) which is determined in consideration of a data amount after division, an effect of short-circuit due to a defect and so on. The value a is the length of the side of a divided dummy line which lies in parallel with a signal line. The value Z is the dummy dividing distance as described earlier. The value L is a distance between a signal line and a dummy line.

Figure 6:
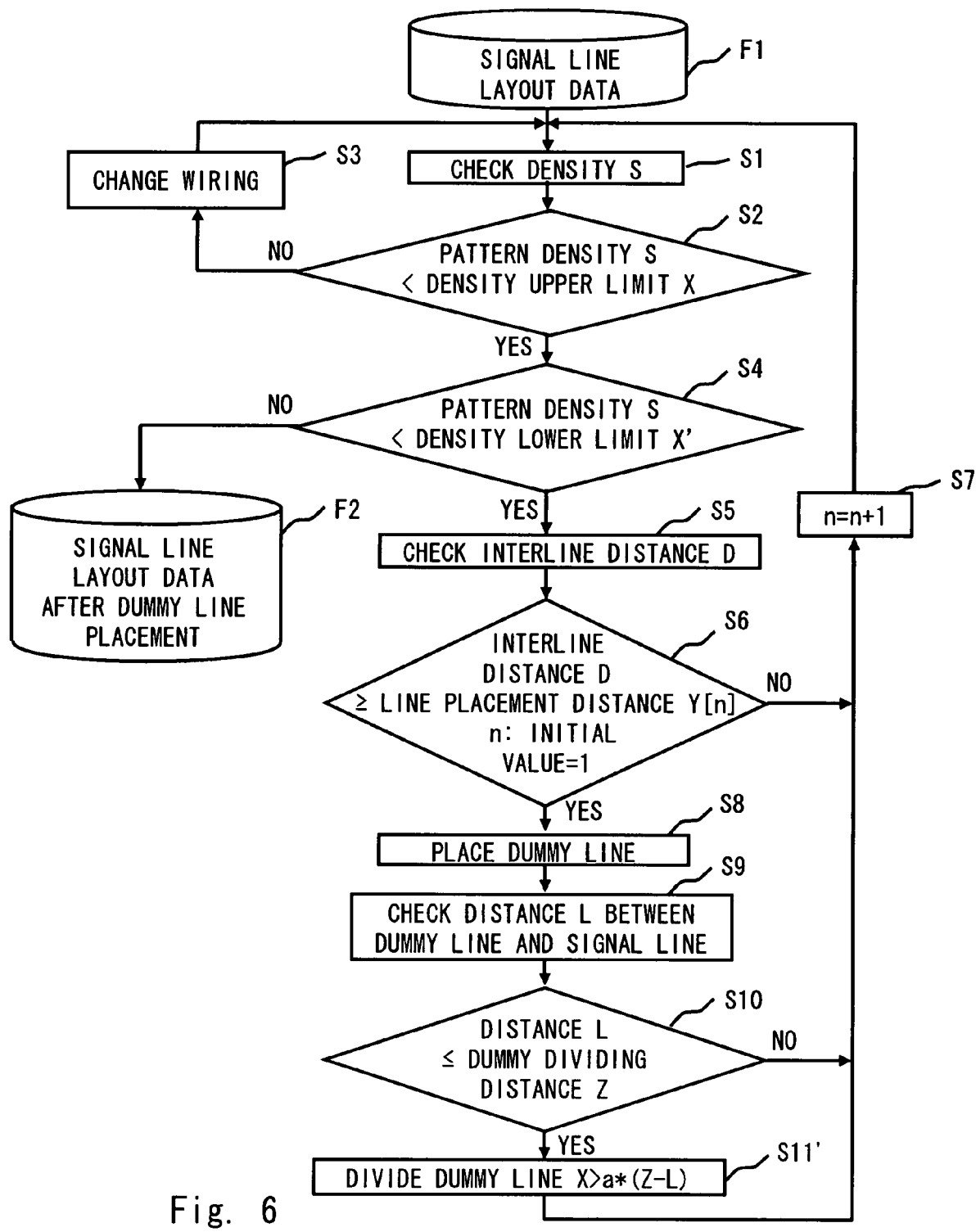
FIG. 6 is a flowchart of the process to place dummy lines according to the second embodiment of the present invention.
Figure 7:
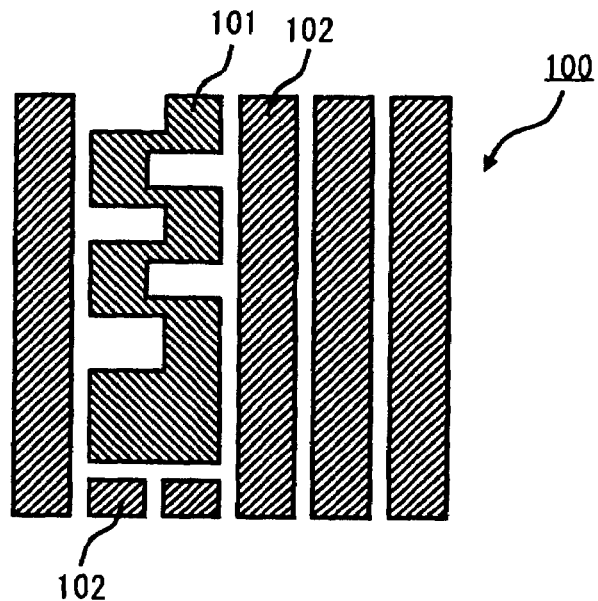
FIG. 7 is a schematic view of the layout of a semiconductor apparatus according to a related art 1.
Figure 8:
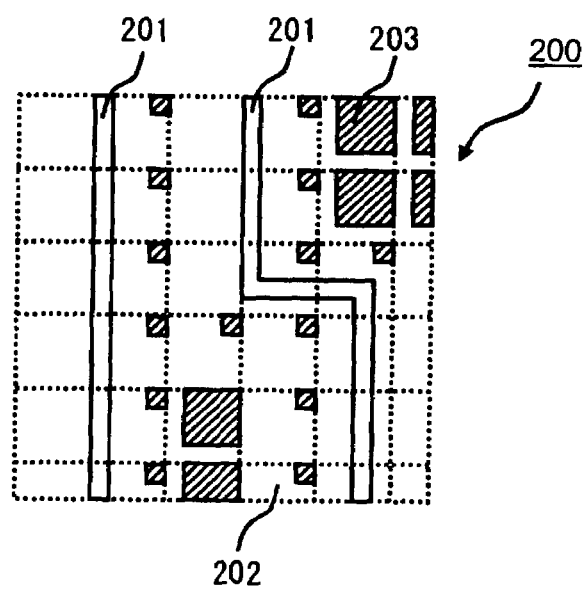
FIG. 8 is a schematic view of the layout of a semiconductor apparatus according to a related art 2.

FIG. 6 shows a flowchart of the process of placing dummy lines according to the second embodiment of the invention. As shown in FIG. 6, the flowchart of the second embodiment is substantially the same as the flowchart of the first embodiment shown in FIG. 4. The second embodiment is different from the first embodiment in Step S11. In the first embodiment, a dummy line is divided to have the predetermined length a of the side in parallel with a signal line. On the other hand, in Step S11' of the second embodiment, the length a of the side of a divided dummy line which is in parallel with a signal line is determined based on the relational expression: X>a*(Z−L).

According to the semiconductor apparatus of the second embodiment, a dummy line which is placed farther from a signal line has a longer length a of the side in parallel with a signal line. The semiconductor apparatus 2 of the second embodiment thus enables further reduction of a data amount compared with the semiconductor apparatus 1 of the first embodiment.

In the semiconductor apparatus 2 of the second embodiment, the length a of the side of a dummy line which is in parallel with a signal line and placed away from the signal line is long. However, the possibility that a large defect would be attached during a manufacturing process is lower than the possibility that a small defect would be attached. Accordingly, there is no substantial difference between the first embodiment and the second embodiment regarding the effect of increasing line capacitance due to the attachment of a defect.

It is apparent that the present invention is not limited to the above embodiment that may be modified and changed without departing from the scope and spirit of the invention. For example, the shape of a dummy line is not restricted to those described in the above embodiments but may be altered as appropriate. Further, although the dummy dividing distance Z is 2 μm in the above-described embodiments, it is preferably smaller than 2 μm in order to suppress the number of patterns or reduce a data amount. This value can be set as appropriate.

What is claimed is:

1. A computer program product, embodied in a computer readable storage device, for placing a dummy line in a floating state in a line layer of a semiconductor apparatus, which when executed, causes a computer to perform the steps of:
   reading layout data and placing the dummy line with a longitudinal side lying in parallel with a signal line in an area where a pattern density of the signal line in a prescribed area is equal to or lower than a density lower limit; and
   dividing the dummy line placed in an area where a distance from the signal line is equal to or shorter than a dummy dividing distance, and wherein the dummy dividing distance is a value that is set according to a maximum value of a defect which can be attached during a manufacturing process.

2. The computer program product, embodied in a computer readable storage device as defined in claim 1, wherein the dummy line is divided in such a way that a length of a side of the dummy line in parallel with the signal line is shorter than a length before division.

3. The computer program product, embodied in a computer readable storage device as defined in claim 1, wherein the dummy line is divided based on the dummy dividing distance.

4. The computer program product, embodied in a computer readable storage device as defined in claim 1, wherein the dummy dividing distance is set based on a size of a defect in a manufacturing process.

5. The computer program product, embodied in a computer readable storage device as defined in claim 1, wherein the dummy line is sequentially placed from an area at a longer distance from the signal distance.

6. The computer program product, embodied in a computer readable storage device as defined in claim 1, wherein the dummy line is placed so that a dummy line width is narrower as a distance of the dummy line from the signal line is shorter.

7. The computer program product, embodied in a computer readable storage device as defined in claim 1, wherein the density lower limit is set based on a manufacturing process.

8. The computer program product, embodied in a computer readable storage device as defined in claim 1, wherein the dummy line is divided in such a way that a value of $a*(Z-L)$, relating to the dummy dividing distance (Z), a distance (L) between the signal line and the dummy line and a length (a) of a side of the dummy line in parallel with the signal line, is equal to or smaller than a prescribed value.

\* \* \* \* \*